(12) United States Patent
Gogoi

(10) Patent No.: US 7,811,896 B2
(45) Date of Patent: Oct. 12, 2010

(54) SEMICONDUCTOR STRUCTURE AND METHOD OF MANUFACTURE

(75) Inventor: Bishnu Prasanna Gogoi, Scottsdale, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 0 days.

(21) Appl. No.: 12/329,936

(22) Filed: Dec. 8, 2008

(65) Prior Publication Data

US 2009/0148999 A1    Jun. 11, 2009

Related U.S. Application Data

(60) Provisional application No. 61/012,878, filed on Dec. 11, 2007.

(51) Int. Cl.
| | |
|---|---|
| H01L 21/76 | (2006.01) |
| H01L 21/425 | (2006.01) |
| H01L 21/31 | (2006.01) |
| H01L 21/469 | (2006.01) |

(52) U.S. Cl. ............... 438/422; 438/514; 438/522; 438/765; 438/766; 438/769; 438/770; 438/775; 438/778; 257/522

(58) Field of Classification Search .......... 438/765, 438/766, 514, 522, 769, 770, 775, 778; 257/522
See application file for complete search history.

(56) References Cited

U.S. PATENT DOCUMENTS 4,356,211 A * 10/1982 Riseman ............... 438/422
5,792,706 A * 8/1998 Michael et al. ........... 438/626
5,846,849 A * 12/1998 Shaw et al. ............... 438/52
6,274,920 B1   8/2001 Park et al.
6,617,252 B2 * 9/2003 Davies ..................... 438/698
6,949,444 B2 * 9/2005 Torres et al. .............. 438/405
7,084,043 B2 * 8/2006 Birner et al. .............. 438/408
2002/0052092 A1  5/2002 Lachner
2003/0146490 A1 * 8/2003 Averett et al. ............. 257/522

(Continued)

FOREIGN PATENT DOCUMENTS

JP    2007273993 A    10/2007

(Continued)

OTHER PUBLICATIONS

International Search Report and Written Opinion for PCT Patent Application No. PCT/US2008/86384, mailed on Jul. 27, 2009, 11 pages.

(Continued)

*Primary Examiner*—Ha Tran T Nguyen
*Assistant Examiner*—Karen M Kusumakar
(74) *Attorney, Agent, or Firm*—Cool Patent, P.C.; Kenneth J. Cool

(57) ABSTRACT

In various embodiments, semiconductor structures and methods to manufacture these structures are disclosed. In one embodiment, a method to manufacture a semiconductor structure includes forming a cavity in a substrate. A portion of the substrate is doped, or a doped material is deposited over a portion of the substrate. At least a portion of the doped substrate or at least a portion of the doped material is converted to a dielectric material to enclose the cavity. The forming of the cavity may occur before or after the doping of the substrate or the depositing of the doped material. Other embodiments are described and claimed.

12 Claims, 8 Drawing Sheets

U.S. PATENT DOCUMENTS

2003/0176055 A1\* 9/2003 Wu .............................. 438/618
2005/0101045 A1\* 5/2005 Shih et al. ...................... 438/48
2006/0258037 A1 11/2006 Fischer et al.

FOREIGN PATENT DOCUMENTS

WO 2009/076510 A2 6/2009

OTHER PUBLICATIONS

International Preliminary Report on Patentability received for PCT Application No. PCT/US2008/086384, Mailed on Jun. 24, 2010, 6 pages.

\* cited by examiner

SEMICONDUCTOR STRUCTURE AND METHOD OF MANUFACTURE

CROSS-REFERENCE TO RELATED APPLICATIONS

The present application claims the benefit of U.S. Provisional Application No. 61/012,878 filed Dec. 11, 2007. Said Application No. 61/012,878 is hereby incorporated herein by reference in its entirety.

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency ("RF") applications, integrated passive devices may be formed using semiconductor processing technology or passive devices such as inductors and/or capacitors may be integrated together with active devices such as transistors using conductive silicon substrates. However, passive devices may have relatively lower quality factors ("Qs") when these passive devices are formed on, or in relatively close proximity to, the conductive silicon substrate. In addition, due to parasitic capacitive coupling between these passive devices and the conductive silicon substrate, the frequency of operation of the integrated devices is reduced. Electrically conductive interconnects or busses can be used to electrically couple different devices within the die and external to the die. The frequency of operation can also be reduced by parasitic capacitive coupling between the interconnects and the conductive silicon substrate.

Further, regions of a semiconductor substrate may be physically and electrically isolated from each other. Additionally, some semiconductor devices, such as power transistors, provide relatively higher output power, which may be utilized in some RF, industrial, and medical applications. Power transistor designers are continually seeking ways to efficiently increase output power by varying the output voltage and current characteristics of a power transistor. For example, a power transistor may be provided having an increased breakdown voltage to enable the power transistor to operate at a relatively higher voltage and provide a relatively higher output power.

Figure 1:
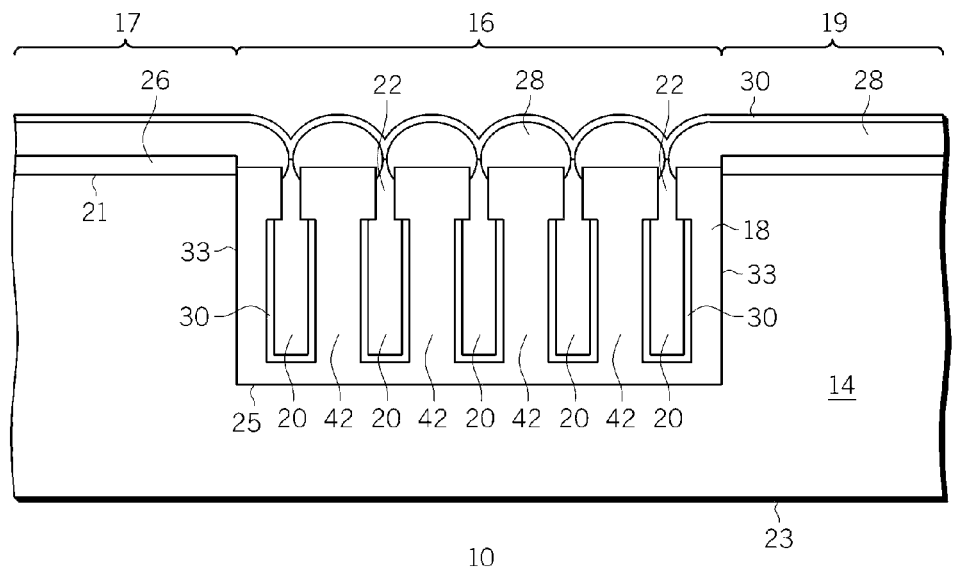
FIG. 1 is a cross-sectional view of a semiconductor structure in accordance with an embodiment of the present invention.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements.

DETAILED DESCRIPTION

In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

In the following description and claims, the terms 'comprise' and "include," along with their derivatives, can be used and are intended as synonyms for each other. In addition, in the following description and claims, the terms "coupled" and "connected," along with their derivatives, can be used. "Connected" can be used to indicate that two or more elements are in direct physical or electrical contact with each other. "Coupled" can mean that two or more elements are in direct physical or electrical contact. However, "coupled" can also mean that two or more elements are not in direct contact with each other, but yet still co-operate or interact with each other. For example, "coupled" can mean that two or more elements do not contact each other but are indirectly joined together via another element or intermediate elements. Finally, the terms "on," "overlying," and "over" can be used in the following description and claims. "On," "overlying," and "over" can be used to indicate that two or more elements are in direct physical contact with each other. However, "over" can also mean that two or more elements are not in direct contact with each other. For example, "over" can mean that one element is above another element but not contact each other and can have another element or elements in between the two elements.

FIG. 1 is a cross-sectional view of a semiconductor structure 10 that illustrates a dielectric platform ("DP") 16 and active regions 17 and 19 Dielectric platform 16 can be referred to as a dielectric structure or a dielectric region. Active regions 17 and 19 can also be referred to as active areas, active area regions or portions of active areas since active devices, or portions of active devices, may be formed in and above active areas 17 and 19.

Dielectric platform 16 of semiconductor structure 10 comprises a plurality of dielectric structures 42, formed in a substrate 14 having a boundary or top surface 21. Substrate 14 also has an opposing boundary or bottom surface 23 that is parallel to, or substantially parallel to, top surface 21. In other embodiments of the present invention, dielectric structures 42 can be pillars, columns, or elongated walls and may also be referred to as protrusions, projections, or partitions. Dielectric structures 42 can comprise silicon dioxide and can be referred to as vertical structures. In addition, platform 16 shown in FIG. 1 can include a sealed cavity 20 and dielectric materials 26, 28 and 30.

Cavity 20 can also be referred to as a void, a gap, an air gap, an opening, a trench, an empty region, an empty space, or the like. In addition, as described herein, in some embodiments of the present invention, cavity 20 can be enclosed, capped, or sealed and also can be hermetically sealed to prevent any contamination from undesirable particles, gasses or moisture that can propagate into, or get trapped in cavity 20. When capped, the cavity can be referred to as a sealed cavity, a sealed gap, a sealed void, a closed cell, or a closed cell void. In some embodiments, cavity 20 can be evacuated to a pressure less than atmospheric pressure. In other words, the pressure in cavity 20 can be below atmospheric pressure. As an example, the pressure in cavity 20 can range from approximately 0.1 Torr to approximately 10 Torr. The type of substance or material within sealed cavity 20 is not a limitation of the present invention. For example, cavity 20 can contain a gas, a fluid, or a solid matter.

In some embodiments, a depth-to-width ration of the depth of the cavity to a width of the cavity may be large to accommodate a specific implementation. For example, the depth of cavity 20 may be at least two times (2×) greater than the width of the cavity. And, in some embodiments, it may be that the depth of the cavity 20 is at least about ten times (10×) greater than the width of the cavity. For example, if the width of the cavity is about 2 microns or less, then the depth of the cavity 20 may be about 10 microns or greater.

Layer 28 may be formed over dielectric structures 42 and cavity 20 to form a sealed cavity 20, as shown. A capping or sealing structure can comprise a layer 28 comprising, for example, silicon dioxide ($SiO_2$), and a thickness ranging from about 0.5 microns (μm) to about 3 μm. In some embodiments, due to the relatively small openings between the upper portions of structures 42, portions of dielectric material 28 can enter into a portion of cavity 20 or a region between the upper portions of adjacent structures 42, but not fill cavity 20 due in part to the relatively small size of the openings between the upper portions of structures 42. The capping or sealing structure may further include a conformal sealing layer 30 such as, for example, silicon nitride ($Si_3N_4$) or silicon dioxide ($SiO_2$), that can be formed over silicon dioxide layer 28 to hermetically seal cavity 20. In other words, the optional conformal silicon nitride layer can fill in any openings or cracks in the silicon dioxide capping layer 28, and in general prevent the propagation of gases or moisture into cavity 20. In one embodiment, the layer 30 can vary in thickness between about 1000 Angstroms ("Å") and about 0.5 μm.

In some embodiments, cavity 20 can be multiple cavities 20 that are physically isolated from each other. Accordingly, if the capping structure that includes materials 26 and 28, or isolated structures 42 experience a rupture or fracture, this rupture or fracture is contained in a limited area so that any contamination external to the dielectric platform 16 that propagates into cavities 20 through the rupture or fracture can be contained in a limited area of dielectric platform 16 due to the physical isolation of the multiple cavities from each other. For example, a closed cell configuration would prevent a fracture or rupture from introducing ambient gas into all of the multiple cavities of dielectric platform 16.

As is discussed below, active devices, or portions of active devices, can be formed in, over, and/or from substrate 14. Substrate 14 may comprise a semiconductor material 14 and active regions 17 and 19 may comprise portions of semiconductor material 14. In some embodiments, semiconductor material 14 comprises silicon and can be referred to as a device layer 14 or an active layer 14. Further, in some embodiments, substrate 14 may include one or more epitaxial layers. In some embodiments, semiconductor material 14 may be formed on a substrate comprised of the same or a different material. In one example, semiconductor material 14 is silicon which is epitaxially grown on a silicon substrate. A substrate may mean a semiconductor material, one or more epitaxial layers formed on a semiconductor material, a semiconductor material disposed on an insulating material, or the like. Substrate 14 may also be referred to as a semiconductor substrate.

Semiconductor layer 14 can include active areas 17 and 19 in which active devices, such as, for example, transistors or diodes, or portions of active devices, can be subsequently formed. In some embodiments, semiconductor material 14 can be formed on a substrate comprised of the same or a different material. In one example, semiconductor material 14 is silicon which is epitaxially grown on a silicon substrate. Active devices can be formed in active regions 17 and 19 using conventional complementary metal oxide semiconductor ("CMOS"), bipolar, or bipolar-CMOS ("BiCMOS") processes.

In some embodiments, the depth or thickness of dielectric platform 16 ranges from about 1 μm to about 100 μm or greater and the width of dielectric platform 16 can be at least about 3 μm or greater. The depth or thickness of dielectric platform 16 can be measured from top surface 21 of substrate 14 to a lower boundary or surface 25 of dielectric platform 16. In some embodiments, lower surface 25 of dielectric platform 16 is parallel to, or substantially parallel to surface 21 of substrate 14. In some embodiments, lower surface 25 of dielectric platform 16 is at a distance of at least about one micron or greater below surface 21 and the width of dielectric platform 16 is at least about three microns or greater. In other embodiments, lower surface 25 of dielectric platform 16 is at a distance of at least about three microns or greater below surface 21 and the width of dielectric platform 16 is at least about three microns or greater. In one example, the thickness of dielectric platform 16 can be about 10 μm and the width of dielectric platform 16 can be about 10 μm. In yet other embodiments, it can be desirable that the thickness of the dielectric platform be equal to, or approximately equal to, the thickness of semiconductor substrate 14. For example, the thickness of the semiconductor die and the width of dielectric platform 16 can be up to about 100 μm. The thickness and width of dielectric platform 16 can be varied depending on the application for dielectric platform 16 and the desired die size of the resulting semiconductor device that uses substrate 14. For example, a relatively thicker dielectric platform can be desired in applications where dielectric platform 16 is used to form high Q passive devices compared to an application where dielectric platform 16 is used for isolation.

In one or more embodiments, dielectric platform 16 is capable of isolating one or more transistor types from one or more other transistor types, and/or to isolate different regions of substrate 14 including surrounding and/or enclosing one or more areas of substrate 14. For example, in one or more embodiments, dielectric platform 16 may have a ring or annular type shape capable of enclosing or at least partially enclosing an area or region within the ring, to isolate the inner region of the ring from the outer region of the ring. In such an embodiment, active region 17 may be disposed within the interior of the ring formed by dielectric platform 16 to be physically and/or electrically isolated from another active region 19 disposed exterior to the ring formed by dielectric platform 16. Likewise, dielectric platform 16 may comprise other various shapes and/or forms to provide isolation between two or more adjacent regions of substrate 14, and the scope of the claimed subject matter is not limited in this respect.

A varying plurality of cavities 20 can be formed in substrate 14. The multiple cavities 20 can be laterally bounded by dielectric structures 42. In embodiments in which multiple cavities 20 are formed in dielectric platform 16, dielectric platform 16 has a closed-cell configuration in that the cavities of dielectric platform 16 can be physically isolated from each other by the dielectric structures 42. Accordingly, if there is any rupture or fracture in dielectric platform 16, contamination of any gases in the cavities can be contained in a limited area due to the closed-cell configuration because the multiple cavities of dielectric platform 16 are physically isolated from each other.

The combination of dielectric structures 42 and cavity 20 reduces the overall permittivity of the dielectric platform 16 so that dielectric platform 16 has a relatively low dielectric constant. In other words, sealed cavity 20 and dielectric structures 42 together reduce the dielectric constant of dielectric platform 16. To minimize the dielectric constant of dielectric platform 16, it is desirable to increase the depth of dielectric platform 16, increase the volume of sealed cavity 20 and reduce the extent of semiconductor material contained in vertical structures 42. In some embodiments, a dielectric constant of at least about 1.5 or lower can be achieved by increasing the volume of cavity 20. The dielectric constant of dielectric platform 16 is reduced compared to, for example, what would be provided by a dielectric platform that has no cavities or voids. The dielectric constant of dielectric platform 16 may also be reduced by increasing the volume of dielectric material in vertical structures 42. Since empty space has the lowest dielectric constant (the dielectric constant of empty space is 1), the more empty space or void space incorporated into the dielectric platform, the lower the overall dielectric constant. Accordingly, increasing the volume of sealed cavity 20 relative to the volume of vertical structures 42 is more effective in decreasing the dielectric constant of dielectric platform 16 compared to increasing the volume of dielectric material in vertical structures 42.

Additionally, less stress is induced in substrate 14 by dielectric platform 16 compared to a solid or filled dielectric structure, because dielectric platform 16 includes substantial volumes that are not occupied by solids having coefficients of thermal expansion that differ from that of substrate 14. A solid or filled dielectric structure (not shown) that includes, for example, an oxide material with no voids can generate stress in an adjacent silicon region during heating and cooling of the dielectric structure and the silicon region due to the coefficient of thermal expansion (GTE) mismatch of silicon and oxide. Accordingly, the stress on the silicon lattice can lead to defects or dislocations in the silicon region. The dislocations can lead to undesirable excessive leakage currents in active devices formed in the active region, and therefore, forming a dielectric structure such as dielectric platform 16 which has cavity 20, can reduce or prevent the formation of dislocations in the adjacent active regions, such as active regions 17 and 19, since cavity 20 can provide relief for the stress. Furthermore, less stress is generated in the formation of dielectric platform 16 compared to a solid or substantially solid dielectric structure in which the solid or substantially solid regions are formed by oxidation because, for example, in silicon, oxidation is accompanied by a 2.2× volume increase.

Silicon dioxide has a dielectric constant of about 3.9. Accordingly, a solid or filled dielectric structure that includes no voids and includes silicon dioxide can have a dielectric constant of about 3.9. As is discussed above, since empty space has the lowest dielectric constant (the dielectric constant of empty space is 1), the more empty space or void space incorporated into the dielectric platform 16, the lower the overall dielectric constant.

In some embodiments described herein, dielectric platform 16 includes one or more voids occupying in excess of 40% of the total volume of dielectric platform 16. This can result in an effective dielectric constant reduction of about 30% or greater, from a dielectric constant of about 3.9 to an effective dielectric constant of about 2.74. In one embodiment, dielectric platform 16 includes one or more voids occupying in excess of 50% of the total volume. This can result in an effective dielectric constant reduction of about 39%, from a dielectric constant of about 3.9 to an effective dielectric constant of about 2.39. Increasing the volume of air or empty space in dielectric platform 16 can result in a dielectric platform 16 having a dielectric constant of about 1.501 less. As a result, passive elements formed over dielectric platform 16 have reduced parasitic capacitances and inductive coupling to the substrate 14. The parasitic substrate capacitance is reduced by both the reduced effective dielectric constant of dielectric platform 16 and the increased thickness of dielectric platform 16.

At least a portion of dielectric platform 16 may be formed below top surface 21 of substrate 14. In some embodiments, a majority of dielectric platform 16 is below top surface 21 of substrate 14. In other embodiments, all of, or substantially all of, dielectric platform 16 is below top surface 21 of substrate 14. Since at least a portion of dielectric platform 16 is formed in and below the surface of the silicon substrate, dielectric platform 16 can be referred to as an embedded dielectric structure 16. Embedded can mean that at least a portion of dielectric platform 16 is below a plane (not shown) that is coplanar to, or substantially coplanar to, top surface 21 of substrate 14. In some embodiments, the portion of dielectric platform 16 below the plane extends from the plane to a depth of at least about one micron or greater below the plane and the portion of dielectric platform 16 below the plane has a width of at least about three microns or greater. In other words, a least a portion of dielectric platform 16 is embedded in substrate 14 and extends a distance of at least about one micron or greater from upper surface 21 toward the bottom surface 23 of substrate 14 and the portion of dielectric platform 16 embedded in substrate 14 has a width of at least about three microns or greater in some embodiments.

Further, dielectric platform 16 can be used to form relatively high quality passive devices such as, for example, capacitors and inductors having a relatively high Q since the dielectric platform 16 can be used to isolate and separate the passive devices from the substrate. Active devices, such as transistors or diodes, can be formed in regions adjacent to, or abutting, dielectric platform 16, and these active devices can be coupled to passive components such as spiral inductors, microstrip transmission lines and the like that are formed over an upper surface of dielectric platform 16. As will be seen in FIG. 2, the upper surface of dielectric platform 16 may be planar. Increasing the distance between the passive components and silicon substrate 14 allows higher Qs to be realized for these passive components.

As an example, a field effect transistor ("FET") (not shown) can be formed in active region 17 and another FET (not shown) can be formed in active region 19. The FETs can be MOSFETs and can include a source region in substrate 14, a drain region in substrate 14, a gate oxide over surface 21 of substrate 14, a gate over the gate oxide, and a channel region which can be formed in a portion of substrate 14. The source, drain, and channel regions of a FET can be formed by forming a doped region in semiconductor substrate 14 and therefore the source, drain and channel regions of a FET may be referred to as doped regions. As discussed above, substrate 14 can comprise a semiconductor material such as, for example, silicon. Substrate 14 may be electrically conductive and may serve as part of a drain region of a vertical transistor formed in active region 19. In this example, a source contact or electrode (not shown) can be formed on or adjacent to an upper surface of substrate 14 and a drain electrode (not shown) can be formed on or adjacent to a lower surface of substrate 14. During operation, the electrical current flow from the source electrode to the drain electrode in the vertical transistor can be substantially perpendicular to the upper and lower surfaces of semiconductor structures 10 and 12. In other words, current flows essentially vertically through the vertical transistor from the electrode located adjacent a top surface of semiconductor structure 10 to a drain electrode located adjacent to the opposite bottom surface of semiconductor structure 10. An example of a vertical transistor is described in United States ("US") patent application having application Ser. No. 10/557, 135, titled "POWER SEMICONDUCTOR DEVICE AND METHOD THEREFOR," filed Nov. 17, 2005, which claims priority to Patent Cooperation Treaty ("PCT") International Application Number PCT/US2005/000205 titled "POWER SEMICONDUCTOR DEVICE AND METHOD THEREFOR," having an International Filing Date of Jan. 6, 2005, and an International Publication Date of Jul. 28, 2005, the contents of both of these patent applications are incorporated herein by reference in their entirety.

Power transistors having relatively high breakdown voltages, and consequently relatively high output power, can be realized by forming a vertical transistor in an active areas 17 and 19 adjacent to dielectric platform 16, as dielectric platform 16 can provide edge termination for field lines such as, for example, the equipotential lines from an electric field in an active area that is adjacent to dielectric platform 16. Higher breakdown voltages can be achieved as the edge termination provided by dielectric platform 16 can reduce curvature of the equipotential lines. As is generally understood, curvature of the equipotential lines results in lower breakdown voltages. To maximize breakdown voltage, the equipotential lines are parallel, or substantially parallel, to upper surface 21 of substrate 14, and these equipotential lines are planar with little, to no curvature.

If relatively high breakdown voltages are desired, then the lateral sidewalls 33 of dielectric platform 16 that contacts the active region is formed to be a dielectric material that is perpendicular, or substantially perpendicular, relative to the upper surface 21 of substrate 14 to allow the equipotential lines to terminate substantially perpendicular at the lateral sidewalls 33 of dielectric platform 16.

Dielectric platform 16 can be adjacent to, abutting, and/or surrounding, active areas 17 and 19 to provide edge termination for terminating equipotential lines in the active areas, which can result in relatively higher breakdown voltages for some kinds of active devices such as, for example, vertical transistors, formed in the active areas.

Figure 9:
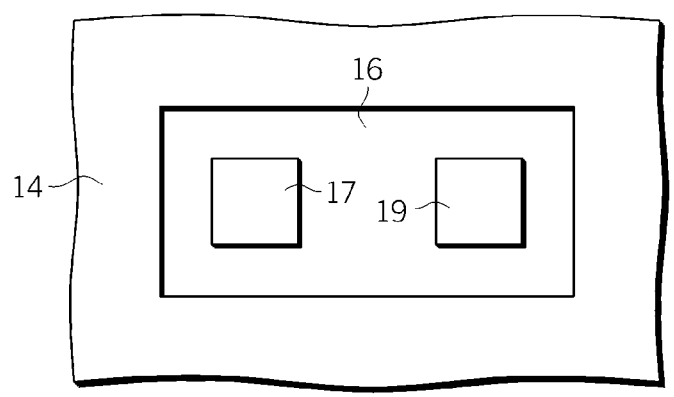
FIG. 9 is a top view of an example semiconductor structure.

In addition, if dielectric platform 16 surrounds one or more active areas, then dielectric platform 16 can also be used to provide electrical isolation. For example, dielectric platform 16 can be used to electrically isolate active regions from each other, which can also result in electrical isolation between any active devices formed in the isolated active areas. Dielectric platform 16 may also be used to provide electrical isolation in semiconductor structure 10. For example, dielectric platform 16 may provide electrical isolation between active region 17 and active region 19. In one example, dielectric platform 16 may be formed to completely surround either or both active regions 17 and 19. Turning briefly to FIG. 9, FIG. 9 is a top view showing an embodiment of semiconductor structure 10 in which a single dielectric platform 16 completely surrounds active areas 17 and 19. Although rectangular shaped active areas 17 and 19 and a rectangular shaped dielectric platform 16 are illustrated in FIG. 9, this is not a limitation of the present invention. In other embodiments, dielectric platform 16 and active areas 17 and 19 may have any arbitrary shape. Although dielectric platform 16 illustrated in FIG. 9 is described as surrounding both active areas 17 and 19, this is not a limitation of the present invention. In other embodiments, one or more dielectric platforms may surround none, or one or more of the active areas and/or one or more dielectric platforms may be formed adjacent to or abutting a portion of one or more active areas.

Although only a single active device is discussed as being formed in active regions 17 and 19, the methods and apparatuses described herein are not limited in this regard. In some embodiments, a plurality of active devices can be formed in active regions 17 and 19. Further, the types of active devices are not limited to being FETs. Other types of devices that can be formed in active regions 17 and 19 include bipolar junction transistors, junction field effect transistors, insulated gate bipolar junction transistors, diodes, thyristors, passive devices, or the like.

Dielectric platform 16 can be fabricated in such a manner, making use of such processes as thermal oxidation processes, such that a top portion 22 of cavities 20 is reduced in size or eliminated. The oxidation process which can be used to form dielectric structures 42 of the dielectric platform 16, can also be implemented to seal or help seal cavities 20 of dielectric platform 16, in a manner which will be described. The oxidation process, when applied to portions of semiconductor materials which have been doped, produces relatively thicker regions of oxide as will be further described. Accordingly, portions of the substrate 14 can be doped, or an additional highly doped semiconductor material can be formed over a portion of the substrate. The doped portion of substrate 14, or the highly doped semiconductor material formed over substrate 14 can be later subjected to the oxidation process as will be described. Use of the oxidation process in conjunction with doped regions, in this manner, can form the upper portions of dielectric structures 42 that extends across upper portions of cavities 20. In the embodiment depicted in FIG. 1 a series of small openings 22 are present between upper portions of dielectric structures 42. Openings 22 can vary between several hundred Angstroms to several microns in width. By reducing or eliminating the width of openings 22, the later application of layer 28 more easily seals or encloses the cavities 20.

Figure 2:
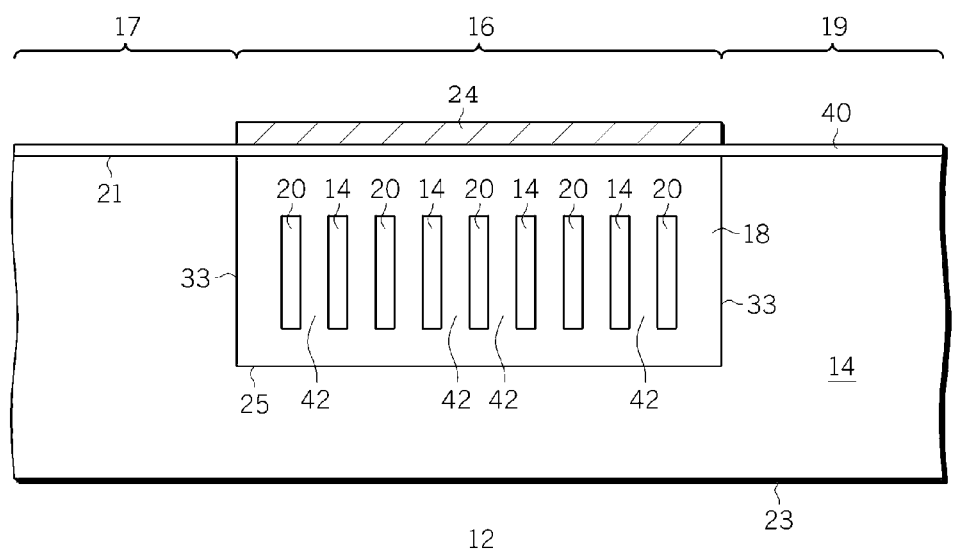
FIG. 2 is a cross-sectional view of a semiconductor structure in accordance with another embodiment of the present invention.

Turning to FIG. 2, an additional embodiment of a semiconductor structure 12, incorporating an additional embodiment of a dielectric platform 16, is depicted. Structure 12 incorporates many of the features seen in FIG. 1, including a substrate 14, in which the dielectric platform 16 can be embedded. Structure 12 again includes active regions 17 and 19, over and in which various active devices previously described can be formed. A variety of passive devices can be formed over dielectric platform 16. The substrate 14, again includes top surfaces 21 and bottom surfaces 23. The dielectric platform 16 has a bottom surface 25 that is embedded in the substrate 14 as shown.

Structure 12 again includes dielectric structures 42. A series of sealed cavities 20 are disposed within the dielectric platform 16. The cavities 20 can be sealed using a thermal oxidation process in conjunction with doped semiconductor material, as previously described. As will be described further below, in a manufacturing step to render the depicted embodiment, a portion of semiconductor material, such as polycrystalline silicon ("polysilicon") can be doped to a high concentration and deposited over a portion of the substrate 14. Again, the thermal oxidation process produces a greater amount of oxide in more heavily doped materials, in proportion to the dopant concentration. Oxidation of the heavily doped material forms the upper portions of dielectric platform 16 and can hermetically seal the cavities 20 if the dopant concentration in the respective semiconductor material (either a portion of substrate 14 or an additional, deposited semiconductor material) is high enough. Accordingly, in other embodiments, similar semiconductor materials, which have been heavily doped, can be utilized.

Dielectric platform 16 can include a conformal sealing layer 40 such as, for example, silicon nitride ($Si_3N_4$) or silicon dioxide ($SiO_2$), which can also be formed over the top surface 21 of substrate 14. The layer 32 can further ensure that the cavities 20 are hermetically sealed, as well as provide additional structural support or further isolation for a particular application. It should be noted, however, that a variety of additional semiconductor materials, such as additional layers 40, additional films, or otherwise, can be deposited over the substrate 14 and platform 16 to provide structural support and/or isolation as necessary for additional active or passive components.

In addition, dielectric platform 16 can be used to increase the frequency of operation of any devices formed using semiconductor structures 10 (FIG. 1) and 12. For example, passive components such as, for example, inductors, capacitors, or electrical interconnects, can be formed in and over dielectric platform 16 and can have reduced parasitic capacitive and inductive coupling between these passive components and semiconductor substrate 14 since the embedded dielectric platform 16 has a relatively low dielectric constant or permittivity and since the embedded dielectric platform 16 increases the distance between the passive components and the conductive substrate. Passive components may also be referred to as passive devices or passive circuit elements. Reducing parasitic substrate capacitances can increase the frequency of operation of any devices formed using a dielectric platform. As an example, the passive component can comprise an electrically conductive material 24 formed over dielectric platform 16, wherein electrically conductive material 24 can comprise, for example, aluminum, copper, doped polycrystalline silicon, gold, nickel, or permalloy. In various examples, the passive component can be an inductor, a capacitor, a resistor, an electrical interconnect, or a combination thereof and the passive component may be coupled to one or more active devices formed in active regions 17 and 19.

Figure 3:
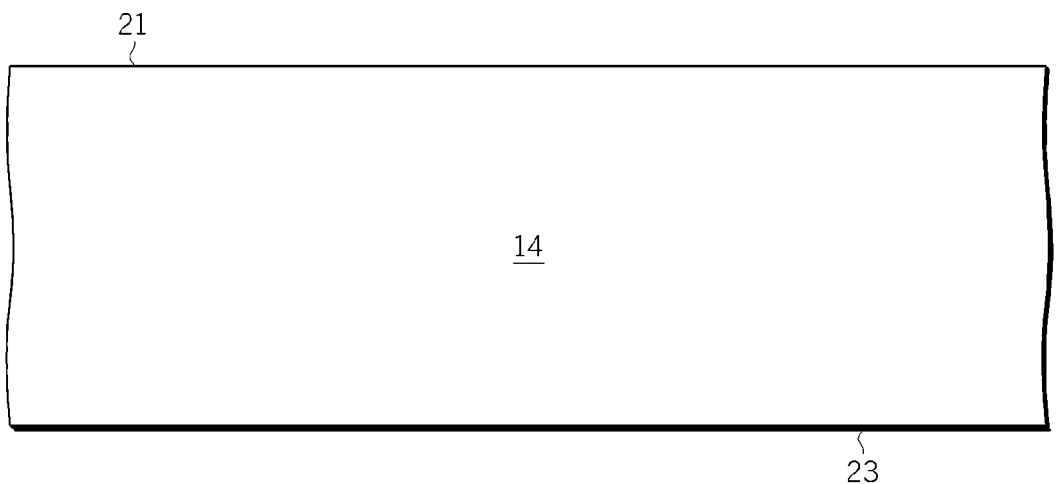
FIG. 3 is a cross-sectional view of the semiconductor structure of FIGS. 1 and 2, at an early stage of manufacture.

FIG. 3 is a cross-sectional view of a semiconductor structure at an early stage of manufacture. What is shown in FIG. 3 is semiconductor substrate 14, which can be used as a substrate for the fabrication of semiconductor structures 10 (FIG. 1), and 12 (FIG. 2). Substrate 14 can comprise a semiconductor material 14 such as, for example, silicon, and can be doped or undoped depending on the application, although the methods and apparatuses described herein are not limited in this regard. Substrate 14 can have a thickness ranging from about 100 μm to about 1,000 μm in some embodiments. However, the thickness of substrate 14 can be reduced through subsequent thinning processes in some embodiments.

Figure 4:
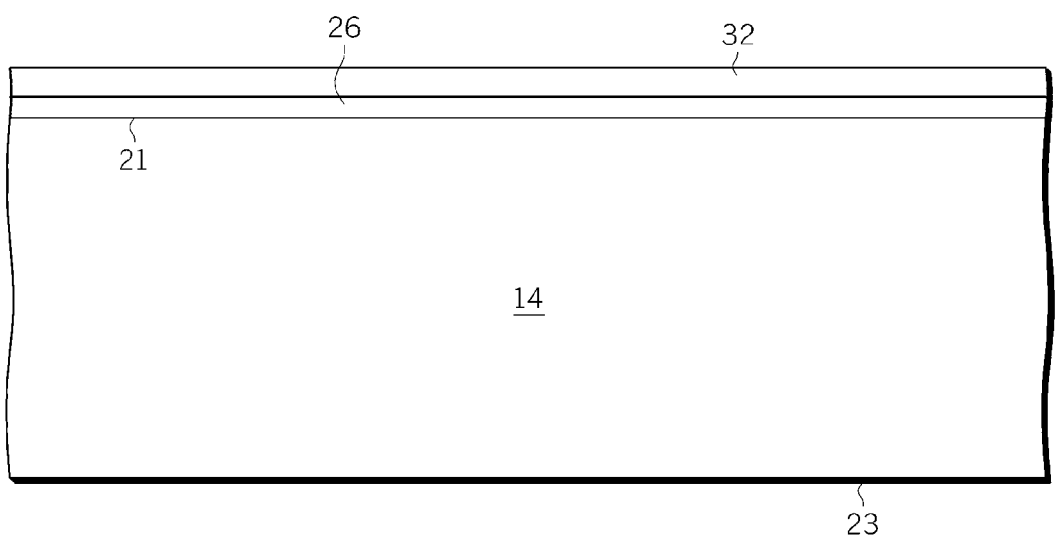
FIG. 4 is a cross-sectional view of the semiconductor structure of FIG. 3 at a later stage of manufacture.

FIG. 4 illustrates a cross-sectional view of the semiconductor structure of FIG. 3 at a later stage of manufacture. A layer of dielectric material 26 is formed on substrate 14. Layer 26 comprises, for example, silicon dioxide ($SiO_2$) and can have a thickness ranging from about 50 Å to about 1000 Å. Dielectric layer 26 can be formed using deposition techniques or thermal growth techniques such as, for example, thermal oxidation of silicon.

A layer of dielectric material 32 is formed on dielectric layer 26. Layer 32 comprises, for example, silicon nitride ($Si_3N_4$) and can have a thickness ranging from about 100 Å to about 2000 Å. In some embodiments, dielectric layer 32 has a thickness that is about two times (2×) greater than the thickness of dielectric layer 26. Dielectric layer 32 can be formed using a low pressure chemical vapor deposition (LPCVD) process.

Dielectric layer 32 can be useful as an etch stop, a protective layer, and/or a mask layer during the processing of structures 10 and 12. Oxide layer 26 is between silicon substrate 14 and silicon nitride layer 32 to prevent damage that can result from forming silicon nitride layer 32 directly on substrate 14. An advantage of forming dielectric layer 32 as silicon nitride and dielectric layer 26 as silicon dioxide is that the silicon nitride serves as an oxidation barrier during subsequent oxidation steps.

Portions of layers 26 and 32 may be patterned using photolithography and etching processes. Photolithography processes or operations involve the use of masks and can sometimes be referred to as masking operations or acts. The photolithography and etching can include forming a layer of a radiation-sensitive material, such as photoresist (not shown), over layer 32, then exposing the photoresist using, for example, ultraviolet (UV) radiation to form a mask, and then etching portions of the layers 26 and 32 using an anisotropic etch process such as, for example, a deep reactive ion etch (DRIE), to form an opening 34 (FIGS. 5A and 5B) in layers 26 and 32.

Dielectric layer 32 or a combination of dielectric layer 26 and dielectric layer 32 can serve as a hard mask, and can be referred to as a masking layer. Since the photoresist (not shown) over dielectric layer 32 is also etched as part of the silicon etch used to etch portions of substrate 14, dielectric layer 32 or a combination of dielectric layer 26 and dielectric layer 32 can be used as a hard mask to prevent the undesired etching of the upper surface of substrate 14. Layers 26 and 32 can be optional, as in alternate embodiments, the photoresist layer can be made relatively thick such that it is not completely eroded during the etching process, and therefore, the photoresist can be used as a masking layer. Use of the photoresist as a masking layer can, in one embodiment, proceed in accordance with a shallow trench isolation (STI) process. Application of photoresist directly to the substrate can proceed in accordance with a shallow trench isolation (STI) process. A layer of photoresist (not shown) is dispensed on silicon nitride layer 32. The layer of photoresist is patterned to form a masking structure 26, 32 having openings 34 (FIGS. 5A, 5B) that expose portions of silicon nitride layer 32.

Figure 5A:
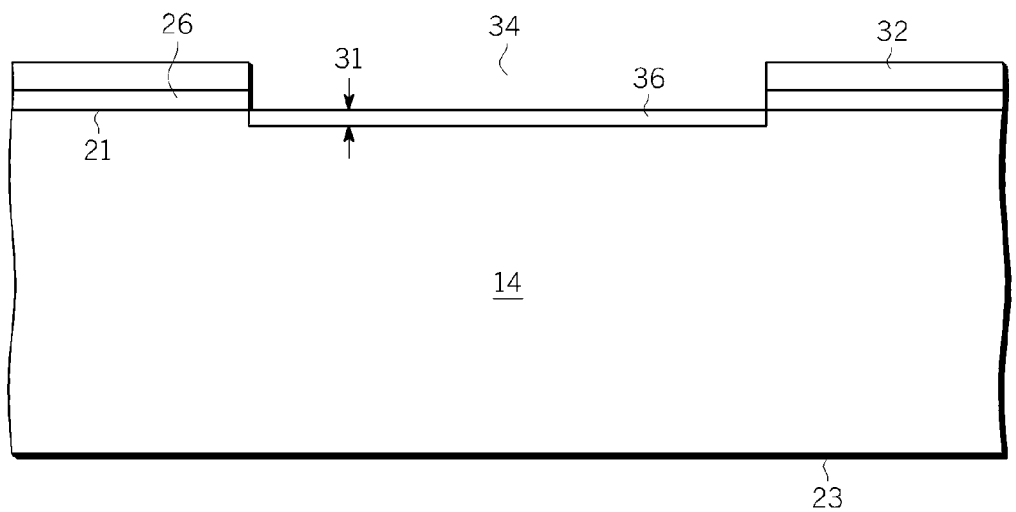
FIG. 5A is a cross-sectional view of the semiconductor structure of FIG. 4 at a later stage of manufacture, according to an exemplary method of manufacture, to ultimately render the embodiment shown in FIG. 1.

FIG. 5A is a cross-sectional side view of the structure of FIG. 4 at a later stage of manufacture. FIG. 5A illustrates a one exemplary method of manufacture, which eventually renders the embodiment of structure 10, depicted in FIG. 1. Similarly, FIG. 5B illustrates another exemplary method of manufacture, which eventually renders the embodiment of structure 12, depicted in FIG. 2.

Figure 5B:
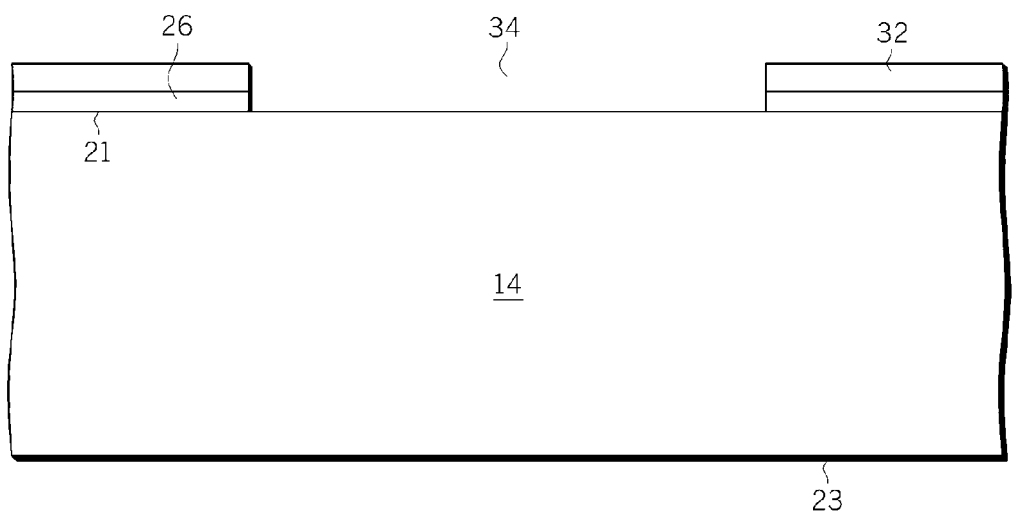
FIG. 5B is a cross-sectional view of the semiconductor structure of FIG. 4 at a later stage of manufacture, according to another exemplary method of manufacture, to ultimately render the embodiment shown in FIG. 2.

With reference to FIGS. 5A and 5B, the exposed portions of silicon nitride layer 32 and the portions of silicon dioxide layer 26 and substrate 14 that are below the exposed portions of silicon nitride layer 32 are removed by, for example, etching, to form an opening 34, and a series of trenches 20 separated by structures 42 (FIGS. 6A and 6B) which will be further described. Opening 34 can also be referred to as a cavity 34. In one embodiment, opening 34 ranges between about 25 microns and about 500 microns in width. In some embodiments, two etching operations, and in other embodiments, three etching operations can be used to form cavity 34 and later, trenches 20 separated by structures 42 of the substrate 14. For example, one etch operation can be used to remove portions of layers 32 and 26 and another etch operation can be used to remove portions of substrate 14. As another example, three etch operations can be used to remove portions of layer 32, later, layer 26, and finally, substrate 14.

Silicon nitride layer 32 can be etched using a wet chemical etch or a dry etch process such as, for example, a reactive ion etch (RIE). Silicon dioxide layer 26 can be etched using a wet chemical etch or a dry etch process such as, for example, a reactive ion etch (RIE). A portion of substrate 14 can next be removed using an anisotropic etch process such as, for example, deep reactive ion etching (DRIE).

Returning to FIG. 5A, once the opening 34 is formed in the oxide layer 26 and nitride layer 32 to expose a portion of the substrate 14, a dopant, or in other words, a certain concentration of dopant atoms, is implanted in the exposed portion of the substrate 14 to render a doped region 36 of substrate 14 as shown. In one embodiment, the substrate 14 is "n doped" with phosphorous (P), although arsenic (As) or antimony (Sb) dopants can also be utilized in particular applications. The doped region 36 can also be referred to as an implant region 36. In the embodiment shown, implant region 36 extends from the surface of substrate 14 to a depth 31 in substrate 14. However, in other embodiments, the region 36 can extend from a point below the surface 21 of the substrate 14. The respective depth 31 of substrate 14 can vary, and in one embodiment, has a depth of up to 1 µm. The dopant concentration, in one embodiment, can vary between $2e^{12}$ and $2e^{16}$ phosphorous atoms per cubic centimeter ($cm^3$), with a corresponding energy between about 50 kiloelectron volts (keV) and about 200 keV. The substrate 14 can then be subjected to a short anneal period to activate the dopant, ranging in activation temperature in one embodiment between about 950 degrees Celsius and about 1100 degrees Celsius.

Figure 5C:
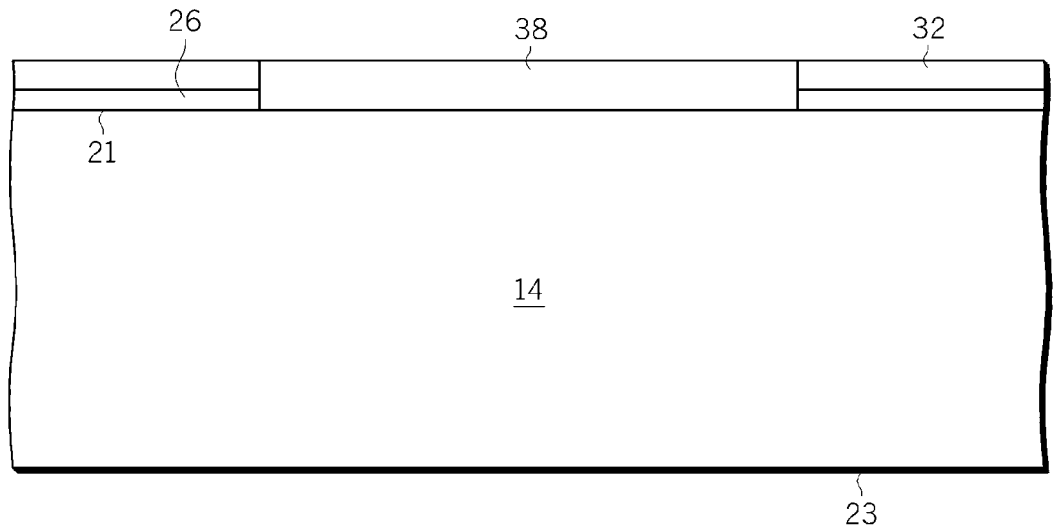
FIG. 5C is a cross-sectional view of the semiconductor structure of FIG. 5B at a later stage of manufacture.

In FIG. 5B, which represents the alternative method of manufacture to render semiconductor structure 12 (FIG. 2), the opening 34 etched in layers 26 and 32 is again seen. In one embodiment, the opening 34 can vary between about 1000 Å and about 5000 Å in depth (measured from the top surface of layer 32 to the top surface 21 of substrate 14). Again, opening 34 exposes the top surface 21 of a portion of the semiconductor substrate 14. In some embodiments, dopant atoms are not implanted directly into substrate 14. Instead, FIG. 5C depicts a layer 38 of highly doped semiconductor material such as polysilicon 38 which is formed in opening 34 (FIG. 5B) over the exposed portion of surface 21 of substrate 14. The highly doped layer 38 can again, in one embodiment, be comprised of a highly n-doped polysilicon where phosphorous atoms are again used as the dopant. A thicker portion of oxide can result from thermally oxidized, heavily doped semiconductor regions than in single crystal regions. For example, phosphorous doped polysilicon has a correspondingly significantly higher oxidation rate than boron doped polysilicon or single crystal silicon materials.

Layer 38 of highly doped semiconductor material can vary in depth or thickness. In one embodiment, a top surface of layer 38 may be parallel with, or approximately parallel with, a top surface of layer 32. In such a case, the depth of layer 38 can correspond to the depth of opening 34, and again vary between 1000 Å and 5000 Å. Layer 38 can be deposited using various techniques, including a low-pressure chemical vapor deposition (LPCVD) process.

Figure 6A:
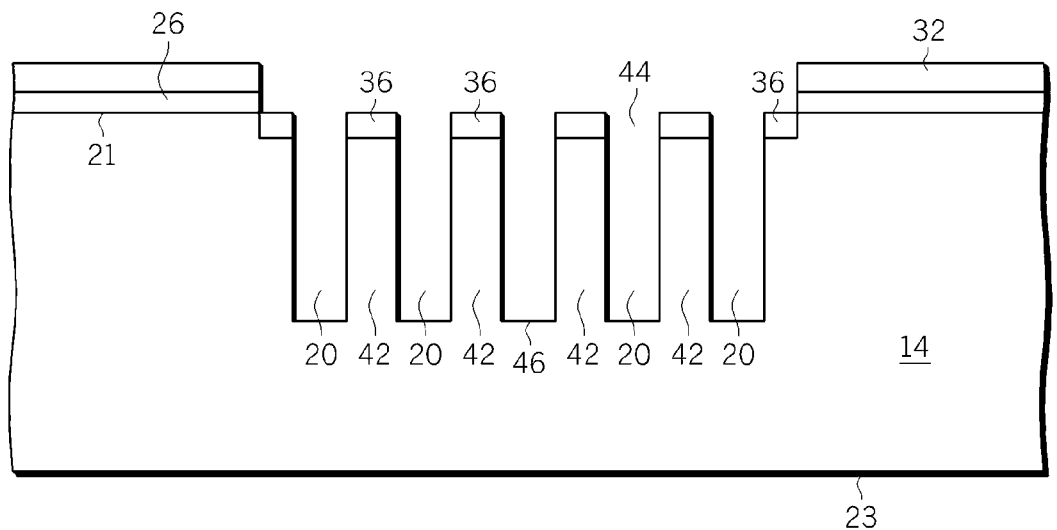
FIG. 6A is a cross-sectional view of the semiconductor structure of FIG. 5A at a later stage of manufacture.

FIG. 6A illustrates the process of etching a series of deep trenches 20 into the silicon substrate, in a later manufacturing step of the embodiment depicted in FIG. 5A. As previously described, a variety of photolithography and etching processes can be used to first, form the opening 34 (FIG. 5A) in the layers 26 and 32, and later, the deep trenches 20 and structures 42. Portions of layers 26 and 32, as well as the exposed, doped portion of substrate 14, can be again patterned using photolithography and etching processes. Trenches 20 can also be referred to as openings, cavities, voids, gaps, empty regions, empty spaces, or the like. After trenches 20 are formed, the photoresist mask (not shown) used to form trenches 20 can be removed or stripped.

Trenches 20 have a floor 46 and a top portion 44. The remaining portions of substrate 14 form vertical structures 42, which may be pillars or walls. In other words, a portion of substrate 14 may be between adjacent trenches 20, or trenches 20 may be isolated from each other by portions of substrate 14. In one embodiment, the dimension of each trench 20 can vary between about 0.5 µm and about 2 µm in width, and between about one µm and about 100 µm in depth. A top portion of each remaining structure 42 is the corresponding portion of remaining doped layer 36. In the depicted embodiment, the trenches 20 are formed such that a portion of doped layer 36 can be found on opposing top surfaces of the lateral sidewalls of cavity 20, as well as along the top surfaces of structures 42.

Figure 6B:
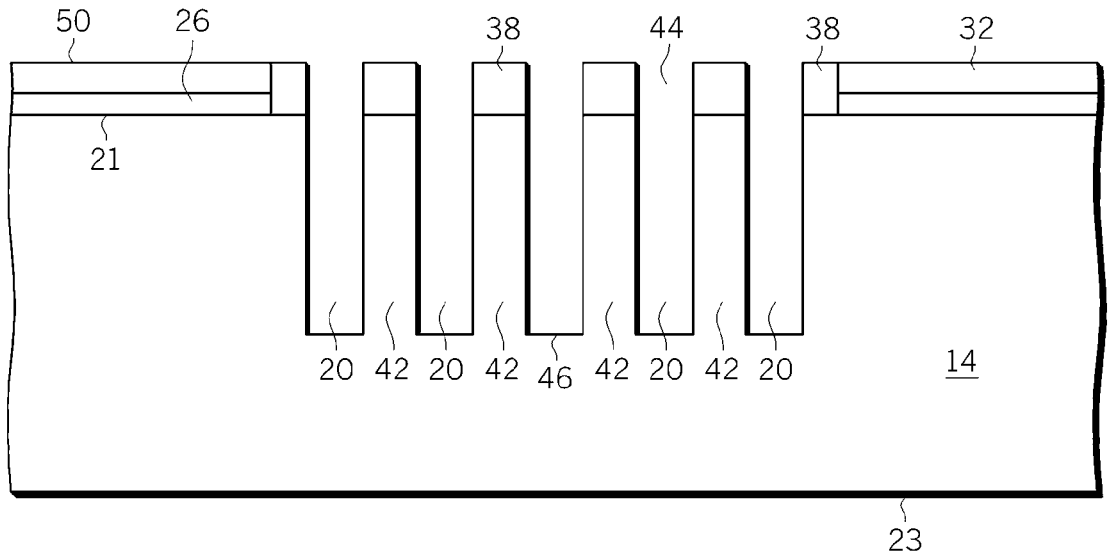
FIG. 6B is a cross-sectional view of the semiconductor structure of 5C at a later stage of manufacture.

In a similar fashion, FIG. 6B illustrates the embodiment depicted in FIG. 5B at a later stage of manufacture. In the depicted embodiment, the series of deep trenches 20 extend from a top surface of the layer 38, to the floors 46. A top portion of each of the remaining structures 42 are the remnants of highly doped semiconductor material layer 38. Here again, the respective dimensions of each trench 20 can vary, and in one embodiment, the dimensions vary between about 0.5 µm and about 2 µm in width, and between about one µm and about 100 µm in depth. In a manner similar to FIG. 6A, the opposing top surfaces of each sidewall include a portion of layer 38 as shown.

In another embodiment, a doping process, in some ways similar to that shown in FIGS. 5A-5C, can occur subsequent to the etching process depicted in FIGS. 6A and 6B. In other words, an etching process can occur first, and a doping process can be performed subsequent to the etching process. In either embodiment, the dopant or doped material remains integrated into or deposited over top surfaces of the structures 42 and substrate 14.

Figure 6C:
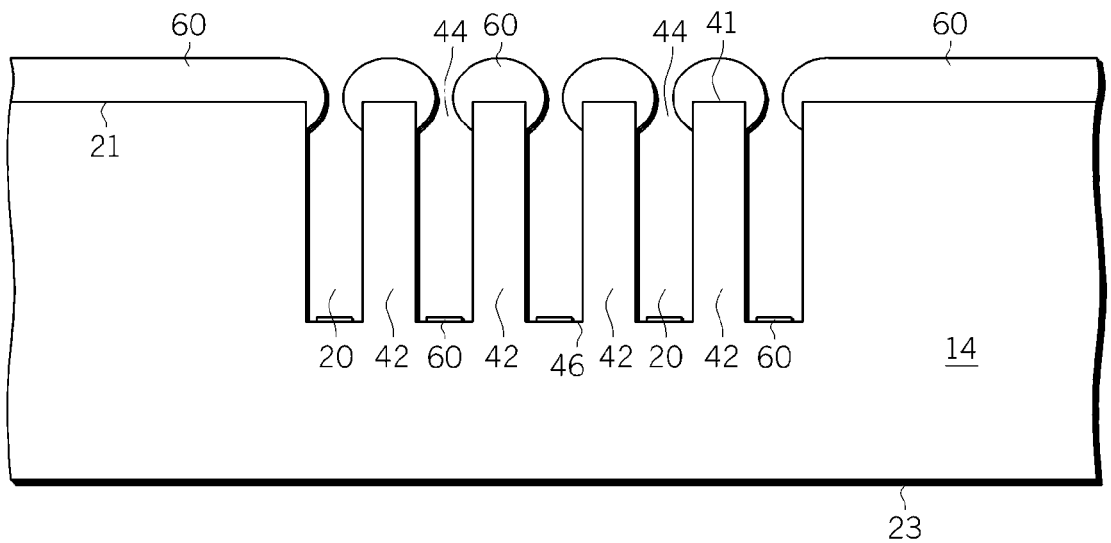
FIG. 6C illustrates an alternate embodiment of a semiconductor structure.

To illustrate an example of a doping process performed subsequent to the etching process, consider the formation of a series of trenches 20 as shown in FIG. 6A. The formation seen in FIGS. 6A and 6B is similar, but in the embodiment illustrated in FIG. 6C, no dopants or doped material would yet be seen integrated into, or deposited over, portions of the substrate 14. FIG. 6C illustrates the formation of trenches 20 and structures 42 in this manner. Once the formation of trenches 20 is accomplished (including removal of photoresist), a thermally reactive material 60 such as plasma-enhanced phosphosilicate glass (PSG), (silica with phosphorous added), can be formed over structures 42 and over surface 21 of substrate 14 using, for example, a so-called "line of sight" deposition process. Material 60 contains dopant atoms which can be thermally imparted to an adjacent material using an annealing process. PSG material, for example, contains phosphorous dopant atoms.

By use of a line of sight deposition or a similar process, much of the PSG may remain on the upper portions of the structures 42, whereas less material 60, or very little material may settle at the bottom surface 46 of trenches 20. Trenches 20 can be designed (patterned and etched) such that more material 60 is deposited on the upper portions of structures 42 rather than on bottom surfaces 46 of trenches 20. To accomplish this end, a top surface 41 of the structures 42 may be etched to be wider than a bottom portion of the structures 42, in one example. In another embodiment, the material 60 is deposited using a spin-on-glass (SOG) process, a low-pressure chemical vapor deposition (LPCVD) process, or a sputtered deposition process. In still another embodiment, a so-called "tilted implant" or angled implant process may be used to implant the dopants into substrate 14 and structures 42.

In some embodiments, the dimensions of the thickness of the material 60 as deposited can vary between about one micron to about three microns or greater. The thickness of the material desired can be dependent upon the percentage of dopant (e.g., phosphorous) in the material 60 itself. In one embodiment, this percentage may vary between about four percent to about eight percent by weight. The annealing process may vary between 900 and 1100 degrees Celsius from about an hour to about five hours. The respective dopant may be driven into substrate 14 and structures 42 in a thickness ranging from about 0.1 micron to about three microns in depth. This depth can depend on the percentage of dopant, the temperature of the annealing process, and the length of the respective anneal. In some embodiments, the annealing process may be a multiple step process.

Once the material 60 has been deposited over substrate 14 as seen in FIG. 6C, the annealing process can be performed to heat the material 60 and drive the dopant (in this case, phosphorous) into the portions of substrate 14 including the upper surfaces of structures 42. The material 60 can then be removed, for example, by use of a wet etching process using hydrofluoric acid ("hydrofluoric acid etch") or a similar product. In some embodiments, a dry etch process may be beneficial to avoid complications (that is, removal of desired material) arising from rinse steps in a wet etch process. The surfaces of substrate 14 and structures 42 then may appear much like FIG. 6A, where a portion of the substrate 14 and structures 42 have been doped, but absent layers 32 and 26. In addition to a PSG material 60, a borosilicate glass (BSG) material may be used to drive a boron dopant into the portions of substrate 15 and structures 42 if a P-type dopant is desired.

Figure 7A:
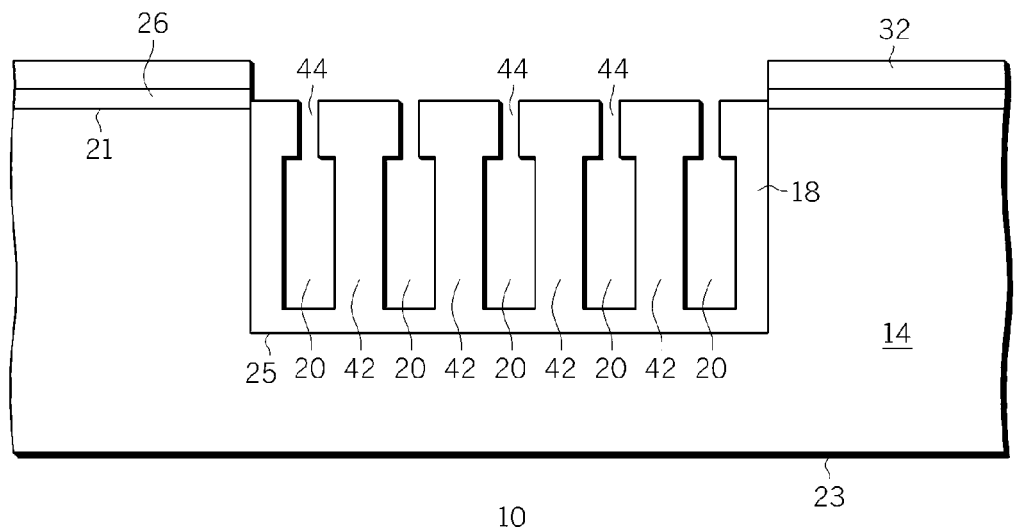
FIG. 7A is a cross-sectional view of the semiconductor structure of FIG. 6A at a later stage of manufacture.

FIG. 7A illustrates the embodiment depicted in FIG. 6A in a later manufacturing step. A thermal oxidation is performed to convert a portion of, all of, or substantially all of, the silicon of structures 42, including the doped layer 36 portions of structures 42, to silicon dioxide to form a dielectric region 18 that includes silicon dioxide structures 42. In some embodiments, it is desirable to use a relatively high oxidation temperature, which can range, for example, between about 1000 degrees Celsius to about 1200 degrees Celsius. As the temperature of oxidation increases, the viscosity of the resultant silicon dioxide decreases which can lower the stress of dielectric region 18. In some embodiments, after the thermal oxidation process is performed as is described to convert a portion of, all of, or substantially all of, the silicon of structures 42 from silicon to silicon dioxide, the distance between the upper portions of silicon dioxide structures 42 (represented by opening 44 as shown) is about 0.5 microns or less and the distance between the lower portions of silicon dioxide pillars 42 is at least about 1.5 microns or greater. In addition to structures 42, the oxidation process also converts other exposed portions of substrate 14 to silicon dioxide to form dielectric region 18.

As is well known, about 2.2 units of silicon dioxide is formed from about one unit of silicon during thermal oxidation. In other words, about 2.2 Angstroms of thermal oxide can be formed from about one Angstrom of silicon. As a result, the formation of silicon dioxide during the thermal oxidation process illustrated with reference to FIG. 7A has the effect of decreasing the spacing between structures 42 (FIGS. 7A and 7B) during the thermal oxidation process. Thus, the spacing between the resulting silicon dioxide structures 42 seen in FIG. 7A is less than the spacing between silicon structures 42 seen in FIGS. 6A and 6B.

Subsequent capping, sealing, or closing of cavity 20 can be facilitated by the thermal oxidation process. Indeed, the present invention, in several embodiments, utilizes processes such as thermal oxidation to better facilitate, or even accomplish, the capping, closing, and sealing of cavities 20. In the semiconductor structure 10, spacing between the upper portions of structures 42 (represented by openings 44) is decreased through processes such as doping and oxidation to a distance that will facilitate capping or sealing of cavities 20 using, for example, a non-conformal dielectric material. The spacing represented by openings 44 can be reduced further, or eliminated, by the thermal oxidation of a highly doped semiconductor material, such as, for example, material 38 (FIG. 5C) deposited over substrate 14 and seen in structure 12 (FIG. 2). Again, subjection of doped region 36 (FIG. 6A) and doped material 38 (FIG. 6B) to a thermal oxidation process can result in a greater portion, that is, wider and/or thicker portion, of oxide than in areas of substrate 14 with less or no dopant concentrations. Oxidation of the doped region 36 (FIG. 6A) and doped layer 38 (FIG. 6B) closes or partially closes the upper portion of cavities 20. Accordingly, oxidizing doped region 36 (FIG. 6A) or doped layer 38 (FIG. 6B) can seal cavities 20. As previously described, the thickness and width of the upper portions of dielectric structures 42 can vary in a proportion to a dopant concentration of region 36 (FIG. 5A) implanted into the portion of the substrate 14 as described above with reference to FIG. 5A. Again, openings 44 can vary in width, from about 0.5 microns or less, in one embodiment, or are eliminated in another embodiment.

Although the thickness or the amount of the silicon dioxide of structures 42 is limited after all of the silicon of structures 42 is consumed during the thermal oxidation process, the thermal oxidation process can continue longer to increase the thickness of the silicon dioxide at the lateral and lower boundaries of dielectric platform 16. In other words, the oxidation process can continue longer to increase the amount of silicon dioxide at the bottom (e.g., floor 46) of cavity 20 and along the lateral perimeter of cavity 20.

The oxidation process described above may be applied to a semiconductor structure which has undergone a doping process subsequent to the etching process, as described in FIG. 6C. Such an oxidation process, again, serves to convert the doped material or doped area as previously described, resulting in the capping, closing, sealing, and encapsulation of cavities 20.

Figure 7B:
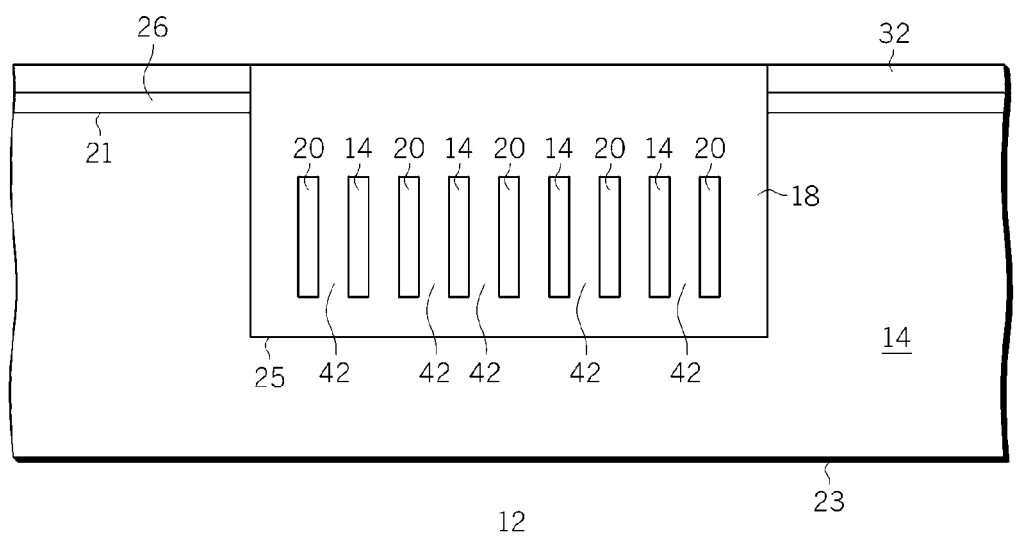
FIG. 7B is a cross-sectional view of the semiconductor structure of FIG. 6B at a later stage of manufacture.

FIG. 7B is a cross-sectional view of the semiconductor structure of FIG. 6B at a later stage of fabrication. FIG. 7B also illustrates a thermal oxidation process that is applied to structures 42 of the semiconductor structure of FIG. 6B, including the highly doped semiconductor material layer 38 (FIG. 6B) at the top portions of each of structures 42 (FIG. 6B). The thermal oxidation process, when applied to the more heavily doped regions of layer 38 (FIG. 6B), forms expansive or thicker regions of oxide at the upper portions of structures 42 than other oxide regions formed along lower portions of structures 42, and can effectively hermetically seal what would otherwise have resulted in openings 44 (FIG. 7A) had a lower concentration dopant material been used. Accordingly, oxidizing doped material 38 (FIG. 6A) can seal cavities 20.

In one embodiment, the resulting thickness, or depth of the upper portion of structures 42 as shown in FIG. 7B is approximately two times (2×) the original thickness or depth of the heavily doped semiconductor material layer 38 (FIG. 5C). For example, if the original depth of the layer 38 (FIG. 5C) is about 3000 Å, then the resultant depth of the resulting capping structure or upper portions of structures 42 (FIG. 7B) is about 6000 Å. As will be appreciated, the dimensions of the capping structure can vary depending on factors as the dopant concentration of layer 38, thermal oxidation time, thermal oxidation temperature, and similar factors. In the embodiment shown in FIG. 7B, a portion of unoxidized substrate 14 remains as portions of structures 42, although as discussed previously, the amount of oxidation in which various components of the trenches 20 receive can also vary. For example, in alternate embodiments, all of, or substantially all of the silicon of structures 42 may be converted from silicon to silicon dioxide.

Figure 8A:
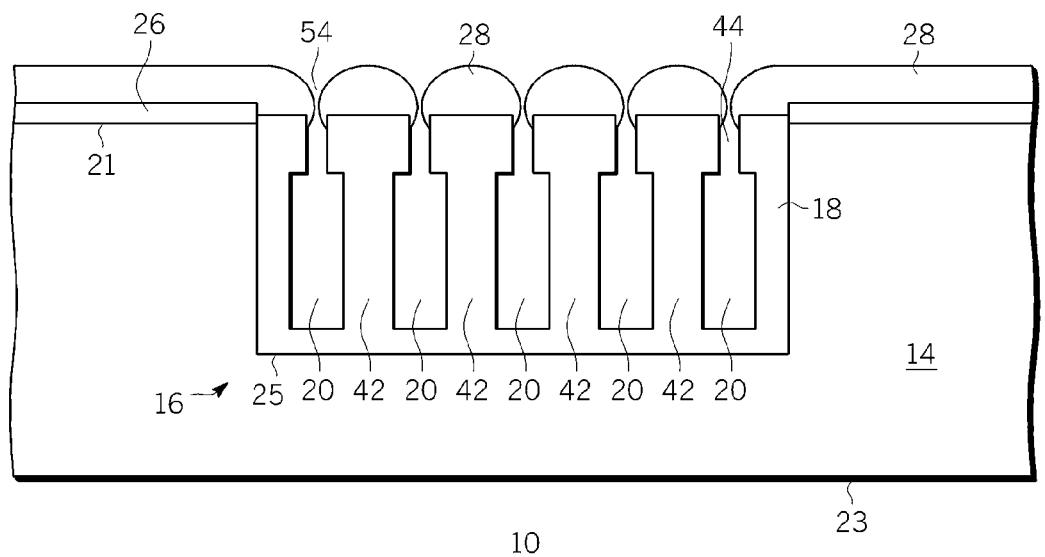
FIG. 8A is a cross-sectional view of the semiconductor structure of FIG. 7A at a later stage of manufacture.

Referring now to FIG. 8A, FIG. 8A is a cross-sectional view of the semiconductor structure of FIG. 7A at a later stage of fabrication. Layer 32 (FIG. 7A) can be removed using, for example, an etch operation. A non-conformal layer 28 can be formed over portions of the layer 26 and over portions of structures 42 to form a sealing structure or capping structure. In some embodiments, layer 28 can comprise silicon dioxide. The layer 28 can be formed by low-temperature chemical vapor deposition (CVD). Other suitable materials for layer 28 include silicon nitride, silicon oxide, phosphosilicate glass (PSG), borophosphosilicate glass (BPSG), an oxide formed using tetraethylorthosilicate (TEOS), or the like. Layer 28, can have a thickness ranging from about 0.5 microns to about 3 microns.

During formation of sealing structure 28, the material of the sealing structure can enter a portion of cavity 20, that is the material of sealing structure 28 can enter between the upper portions of adjacent pillars 42, but not fill cavity 20 due in part to the relatively small size of the openings 44 between the upper portions of structures 42. In particular, the material of layer 28 can close, partially close, or substantially close or seal the openings 44 at locations 54. Layer 28 can be planarized using, for example, a Chemical Mechanical Planarization ("CMP") technique.

An optional, conformal sealing layer 30 (FIG. 1) such as, for example, silicon nitride ($Si_3N_4$), can be formed over layer 28 to hermetically seal cavity 20 to form sealed cavities 20. In other words, in embodiments where sealing structure 28 is a silicon dioxide layer, an optional conformal silicon nitride layer 30 can prevent diffusion through and/or fill in any openings or cracks in the silicon dioxide capping structure 28, and in general prevent the propagation of gases or moisture into cavities 20 through sealing structure. Sealing layer 30 can be formed using a low-pressure chemical vapor deposition (LPCVD) and can have a thickness ranging from about 1000 Angstroms to about 0.5 microns. In one embodiment, the thickness of sealing layer 30 is about 1000 Angstroms. A partial vacuum can be formed in sealed cavities 20 as part of the LPCVD process. In embodiments where layer 28 does not completely seal cavities 20, conformal sealing layer 30 may also be formed along the bottom surface and sidewalls of cavities 20. If optional sealing layer 30 is used, any CMP can be performed prior to the formation of optional sealing layer 30 since the CMP can completely remove the relatively thin sealing layer 30.

Referring back to FIG. 1, the capping or sealing of cavities 20 to form sealed cavities 20 can be accomplished by forming a non-conformal material followed by a conformal material. In some embodiments, the non-conformal layer such as, for example, layer 28, can enter into a portion of cavity 20 or a region between the upper portions of adjacent structures 42, but not fill cavity 20 due in part to the relatively small size of the openings 44 between the upper portions of structures 42 and since layer 28 is a non-conformal layer. Then a conformal material such as, for example, layer 30, can be formed on layer 28.

In some embodiments, cavity 20 is evacuated to a pressure less than atmospheric pressure. In other words, the pressure in sealed cavity 20 is below atmospheric pressure. As an example, the pressure in cavity 20 can range from approximately 0.1 Torr to approximately 10 Torr. The type of substance or material within cavity 20 is not a limitation of the present invention. For example, cavity 20 can contain a gas, a fluid, or a solid matter.

Although a series of five capped or sealed cavities 20 are described with reference to FIGS. 6A to 8C, the methods and apparatuses described herein are not limited in this regard. In other embodiments, substrate 14 can be etched in such as way as to form greater than five, or less than five cavities 20 integrated into the substrate 14. As described previously, the present invention contemplates that a series of sealed cavities can be physically isolated from each other. Accordingly, if sealing structure 28 experiences a rupture or fracture, contamination from any gases in cavities 20 can be contained in a limited area due to the physical isolation of the multiple cavities from each other. Layers 28 and 30 form a capping or sealing structure to form seal cavity or cavities 20. Layers 28 and 30, in combination with sealed cavity 20 and dielectric region 18 which includes structures 42 together form Dielectric Platform ("DP") 16, as part of semiconductor structure 10 shown in FIG. 1.

Figure 8B:
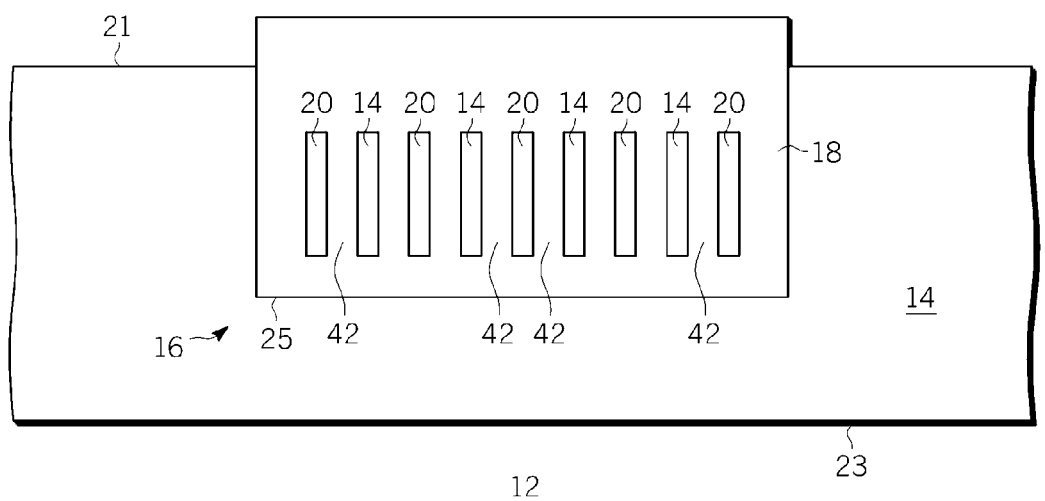
FIG. 8B is a cross-sectional view of the semiconductor structure of FIG. 7B at a later stage of manufacture.

Turning to FIG. 8B, a next step in the manufacturing process to form semiconductor structure 12 (FIG. 2) is depicted. FIG. 8B is a cross-sectional view of the semiconductor structure of FIG. 7B at a later stage of fabrication. FIG. 8B illustrates the removal of the layers 26 and 32. Layers 26 and 32 can be removed using one or more etching operations. For example, layer 32 can be removed using a hot phosphoric etch process, whereas layer 26 can be removed using a hydrofluoric acid etch process. The removal process exposes the top surfaces 21 of substrate 14. As seen, following the completion of the removal process, a portion of dielectric region 18 extends above surface 21 of substrate 14.

Figure 8C:
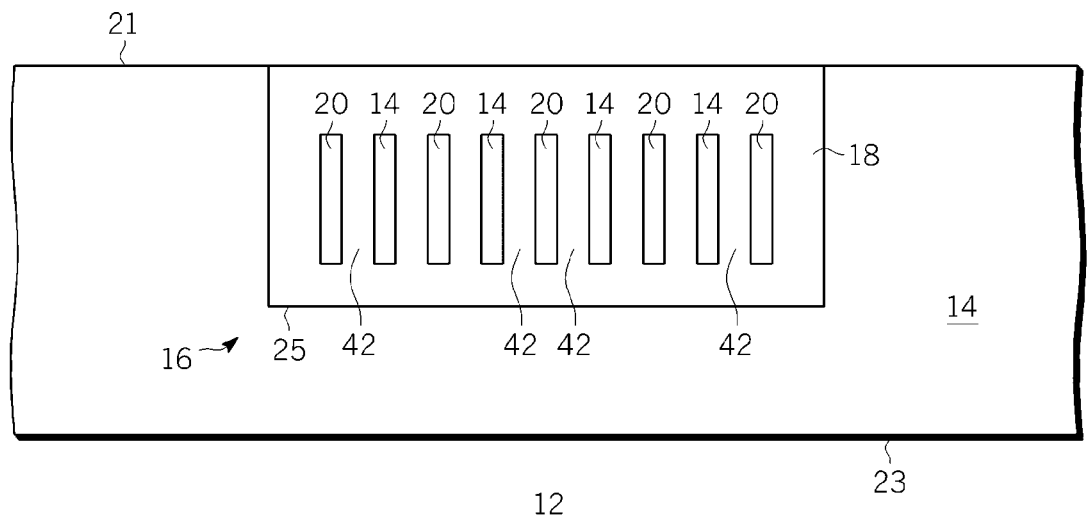
FIG. 8C is a cross-sectional view of the semiconductor structure of FIG. 8B at a later stage of manufacture.

As a next step in the fabrication of semiconductor structure 12, FIG. 8C demonstrates the process of removing a portion of dielectric region 18. A chemical mechanical polishing (CMP) process can be implemented to remove portions of dielectric region 18 and portions of substrate 14. In one embodiment, following the completion of the CMP step, atop surface of dielectric region 18 is parallel with, or substantially parallel with the top surface 21 of semiconductor substrate 14. As is discussed above, cavities 20 are sealed by the conversion of portions of doped semiconductor layer 38 (FIG. 6B) into dielectric region such as, for example, oxide regions. The individual portions 38 (FIG. 6B) grow together to form a sealed capping structure and hermetically seal cavities 20.

Referring back to FIG. 2, in a next step, an optional, conformal dielectric layer 40 can be deposited over the top surfaces of dielectric region 18 and substrate 14 to provide additional isolation and/or structural support as previously described. The layer 40 can include materials, such as, for example, silicon nitride ($Si_3N_4$) or a similar dielectric material. Like sealing layer 30 of structure 10 (FIG. 1), dielectric layer 40 can be formed using a low-pressure chemical vapor deposition (LPCVD) process and can have a thickness of ranging from about 1000 Å to about 0.5 microns or greater. In one embodiment, the thickness of layer 40 is about 1000 Angstroms (Å). Layer 40 forms a capping or sealing structure to further seal and cap cavity 20. Layer 40, in combination with sealed cavities 20 and dielectric region 18 which includes dielectric structures 42 together form Dielectric Platform ("DP") 16, as part of semiconductor structure 12 shown in FIG. 2.

Referring back to FIGS. 1 and 2, active and passive semiconductor devices can be formed in or from the portions of substrate 14 adjacent DP 16. In addition, passive circuit elements, or portions thereof, such as electrically conductive material 24 (FIG. 2) can be formed over DP 16.

Although dielectric platform 16 is described as having one or more cavities 20, the methods and apparatuses described herein are not limited in this regard. For example, in alternate embodiments, cavity 20 could be filled with a material, such as, for example, a material comprising an oxide, nitride, or silicon if so desired, to form a solid or filled dielectric platform (not shown) that is devoid of any cavities. Such a solid or filled dielectric platform would have a relatively higher dielectric constant compared to an air-gap dielectric platform such as dielectric platform 16 since the material used to fill cavity 20 would have a higher dielectric constant compared to an opening or void. Examples of materials that can be used to fill, or backfill, cavity 20 can include silicon nitride, polycrystalline silicon, or an oxide material formed using, for example, a hot wall TEOS process.

The implantation of a dopant into a portion of substrate, or the deposition of a doped semiconductor material over a portion of substrate, previous to the trench etching process, and later, the thermal oxidation process, allows for a region of dielectric material to be formed which can better facilitate, or even accomplish, the encapsulation or sealing of cavities integrated into the dielectric platform. Accordingly, as is discussed above, a portion of a doped substrate can be converted to a dielectric material to seal, enclose, or partially close, a cavity in a semiconductor substrate and at least a portion of a doped material can be converted to a dielectric material to seal, enclose, or partially close, a cavity in a semiconductor substrate. Incorporating the dopant step in the fabrication process improves the efficiency of the process by requiring less material and manufacturing time to facilitate the sealing of the various cavities integrated into the dielectric platform. Finally, use of additional dielectric structures or materials such as layers 40 and/or 30 in the dielectric platform promotes additional isolation and/or structural support for various passive and active devices that may be later integrated in and over the semiconductor structures.

Accordingly, various structures and methods have been disclosed to provide a relatively thick, embedded dielectric platform that can be a dielectric support structure capable of supporting one or more passive devices over the dielectric platform. In various embodiments, the disclosed dielectric platform can provide electrical isolation, reduce parasitic substrate capacitance and inductive losses, allow for the formation of passive devices having a relatively high Q, and enable relatively higher frequency of operation and/or enable relatively higher breakdown voltages of any devices formed using, or in conjunction with, a structure that includes the disclosed dielectric platform. In addition, the disclosed dielectric platform and the methods for making the dielectric platform can reduce stress that can be imparted to regions adjacent to the dielectric platform compared to other techniques and structures.

Although specific embodiments have been disclosed herein, it is not intended that the claimed subject matter be limited to the disclosed embodiments. Modifications and variations can be made without departing from the spirit of the claimed subject matter. It is intended that the claimed subject matter encompass all such modifications and variations as fall within the scope of the claims.

What is claimed is:

1. A method, comprising:
   forming a cavity in a substrate to expose at least a portion of the substrate in the cavity;
   directly doping the exposed portion of the substrate to render a doped region of substrate in the cavity;
   etching at least one or more trenches in the cavity in the doped region of the substrate; and
   converting at least a portion of the doped region of the substrate to a dielectric material to seal at least one or more of the trenches in the cavity.

2. The method of claim 1, wherein the forming of the cavity in the substrate occurs subsequent to the doping of the portion of the substrate.

3. The method of claim 1, wherein the doping of the portion of the substrate occurs after the forming of the cavity in the substrate.

4. The method of claim 1, wherein the cavity extends from a first surface of the substrate to a distance of at least about one micron or greater towards a second surface of the substrate, wherein the second surface is parallel to, or substantially parallel to, the first surface and further comprising forming an electrically conductive material over the dielectric material.

5. The method of claim 4, further comprising forming at least a portion of an active device in the substrate adjacent to the cavity, wherein the active device is electrically coupled to the electrically conductive material.

6. The method of claim 4, wherein the dielectric material comprises oxide, the substrate comprises silicon, and the electrically conductive material comprises aluminum, copper, doped polycrystalline silicon, gold, nickel, or permalloy, or combinations thereof.

7. The method of claim 1, further comprising forming a non-conformal material over the dielectric material.

8. The method of claim 7, further comprising forming a conformal material over the non-conformal material to hermetically seal the cavity, wherein the forming of the non-conformal material comprises deposing the non-conformal material using a chemical vapor deposition (CVD) process.

9. The method of claim 1, further comprising:
forming a first dielectric layer over the substrate;
forming a second dielectric layer over the first dielectric layer;
said forming a cavity comprising forming an opening in the first and second dielectric layers, wherein a width of the opening is about 25 microns or greater, a width of the cavity ranges from about 0.5 microns to about 2 microns, and a depth of the cavity is about ten microns or greater.

10. The method of claim 1, wherein a depth the cavity is at least about two times (2×) greater than a width the cavity.

11. The method of claim 1, wherein a depth of the cavity is at least about ten times (10×) greater than a width the cavity.

12. The method of claim 1, wherein the substrate comprises silicon and the dielectric material is silicon dioxide and the converting comprises forming the silicon dioxide by performing a thermal oxidation process to convert a least a portion of the silicon substrate to the silicon dioxide.

\* \* \* \* \*

UNITED STATES PATENT AND TRADEMARK OFFICE
CERTIFICATE OF CORRECTION

| | | |
|---|---|---|
| PATENT NO. | : 7,811,896 B2 | Page 1 of 1 |
| APPLICATION NO. | : 12/329936 | |
| DATED | : October 12, 2010 | |
| INVENTOR(S) | : Bishnu Prasanna Gogoi | |

It is certified that error appears in the above-identified patent and that said Letters Patent is hereby corrected as shown below:

On the Title Page Item (56), under "OTHER PUBLICATIONS", line 1, delete "for" and insert -- received for --, therefor.
In column 3, line 54, delete "(Si3N4)" and insert -- $(Si_3N_4)$ --, therefor.
In column 19, line 10, in claim 10, delete "the" and insert -- of the --, therefor.
In column 19, line 11, in claim 10, delete "the" and insert -- of the --, therefor.
In column 20, line 2, in claim 11, delete "the" and insert -- of the --, therefor.
In column 20, line 7, in claim 12, delete "a least" and insert -- at least --, therefor.

Signed and Sealed this

Eighteenth Day of January, 2011

David J. Kappos
*Director of the United States Patent and Trademark Office*